United States Patent [19]
Tanten et al.

[11] Patent Number: 5,805,004
[45] Date of Patent: Sep. 8, 1998

[54] INTEGRATED CIRCUIT ARRANGEMENT FOR MINIMIZING THE TEMPERATURE-DEPENDANT OFFSET VOLTAGE OF AN AMPLIFIER

[75] Inventors: Leo Tanten; Bernd Mueller, both of Reutlingen; Martin Barth, Gaertringen, all of Germany

[73] Assignee: Robert Bosch GmbH, Stuttgart, Germany

[21] Appl. No.: 612,051

[22] Filed: Mar. 7, 1996

[30] Foreign Application Priority Data

Mar. 7, 1995 [DE] Germany .................. 195 08 027.0

[51] Int. Cl.$^6$ .................. H03L 5/00; H01L 35/00
[52] U.S. Cl. .................. 327/307; 327/513; 327/362
[58] Field of Search .................. 327/512, 513, 327/560–563, 307, 362, 363, 83, 138, 378, 538

[56] References Cited

U.S. PATENT DOCUMENTS

| | | | |
|---|---|---|---|
| 3,992,622 | 11/1976 | Numata et al. ................. | 327/513 |
| 4,015,149 | 3/1977 | Tsunekawa et al. ................. | 327/513 |
| 4,914,357 | 4/1990 | Valley ................. | 327/513 |
| 5,030,849 | 7/1991 | Brokaw ................. | 327/513 |
| 5,144,405 | 9/1992 | Naber ................. | 327/513 |

*Primary Examiner*—Toan Tran
*Attorney, Agent, or Firm*—Kenyon & Kenyon

[57] ABSTRACT

An amplifier is connected to a voltage subtractor which is connected in a predetermined current path of the amplifier to adjust the temperature-dependent voltage offset of an amplifier or of an amplifier chain. If the voltage subtractor is connected at the output of the amplifier or of an amplifier chain, then the temperature-dependent offset voltage can be subtracted using suitable means, without the amplifier itself having to be compensated. As a voltage subtractor, an operational amplifier is proposed, in the case of which the offset voltage is subtracted by means of negative feedback. The negative feedback is produced by means of a resistor having two current power sources. The voltage subtractor is preferably connected in outgoing circuit to the amplifier and constructed in accordance with the same layout rules.

7 Claims, 2 Drawing Sheets

INTEGRATED CIRCUIT ARRANGEMENT FOR MINIMIZING THE TEMPERATURE-DEPENDANT OFFSET VOLTAGE OF AN AMPLIFIER

FIELD OF THE INVENTION

The present invention relates to an integrated circuit for an amplifier which has an offset adjustment for minimizing the temperature-dependent voltage offset.

BACKGROUND INFORMATION

When working with known monolithically integrated amplifier circuits in bipolar technology, in the case of operational amplifiers, the base-emitter voltages of the two reference transistors are adjusted. The adjustment is carried out by suitably adapting the emitter current in one of the two transistors. However, this adjustment does not always have an effect over the entire temperature range, since in practice, the adjusted components are arranged at different points on a semiconductor chip. As a result, these components can assume different temperatures, leading again, in turn, to a temperature dependence.

It is also unfavorable that, as a rule, the amplifier adjustment also affects the negative feedback of the amplifier circuit, so that, with the adjustment, a predetermined accuracy can only be achieved for certain operating points. Guaranteeing the temperature-dependent offset voltage of the amplifier for a broad operating range, as well, entails considerable outlay.

SUMMARY OF THE INVENTION

In contrast, the integrated circuit in accordance with the present invention for an amplifier for minimizing the temperature-dependent voltage offset has the advantage that the subtracted offset voltage has the same response to temperature changes (temperature sensitivity) as the amplifier. As a result, this circuit arrangement can be used in a broad operating range, temperature influences having virtually no influence on the integrated circuit.

Advantageous further developments and improvements of the integrated circuit according to the present invention include that the offset adjustment can be made at any desired location on an amplifier chain. Thus, the voltage subtractor can be connected to the amplifier at the amplifier's input or output. It is also advantageous that, given a high amplification of the amplifier or of an amplifier chain when working with a downstream voltage subtractor, the expenditure required for the offset adjustment is relatively low, since it is not necessary for every single amplifier in the amplifier chain to be adjusted.

An operational amplifier is preferably used as a voltage subtractor, in whose feedback path the offset current can be subtracted with the help of simple power current sources. In particular, a resistor, whose current is controlled by the power current sources, can be connected in the feedback path of the operational amplifier.

To adjust the offset voltage, known means can be used to design the resistor or one or both of the power current sources to be adjustable, so that the temperature-dependent offset voltage can be easily adjusted to a preselected value.

To enable the response to temperature changes to become effective over a broad operating range, the subtractor amplifier is constructed in accordance with the same design rules as the amplifier. Thus, the voltage subtractor circuit has a temperature coefficient substantially equal to the temperature coefficient of the amplifier circuit. The temperature-sensitive elements are arranged side-by-side, as close together as possible, so that they will assume the same temperature.

It is particularly beneficial to use the same power current source for supplying current to the adjusting components, both when working with the amplifier as well as with the operational amplifier, in order to avoid tolerance errors of the power current sources. Ring-type current sources have proven to be especially suitable, since their current can be adjusted with simple means.

DETAILED DESCRIPTION OF THE INVENTION

Figure 1:
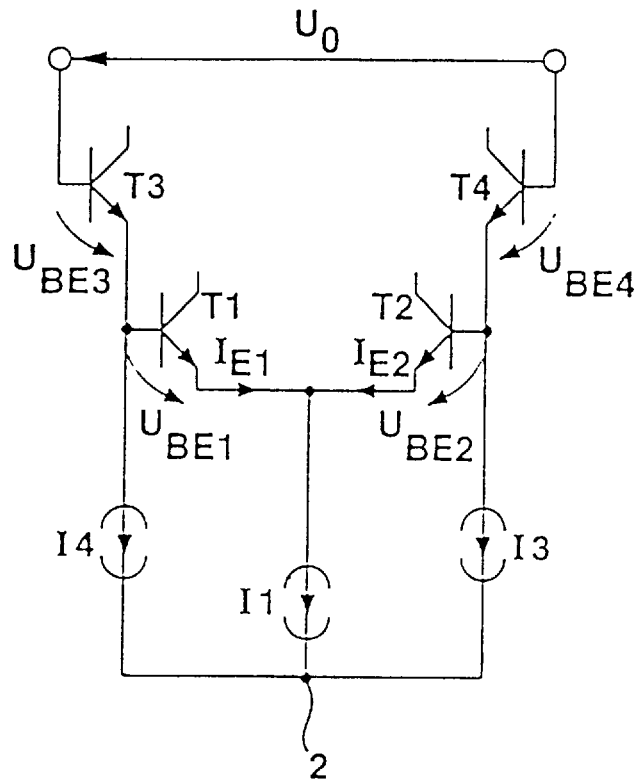
FIG. 1 depicts an exemplary prior art circuit arrangement.

FIG. 1 depicts a known circuit arrangement for compensating for the temperature-dependent offset voltage on a differential amplifier, with the two back-to-back connected transistors T1, T2. In this monolithically integrated amplifier circuit, the two emitter currents $I_{E1}$, $I_{E2}$ are equal in magnitude, independent of the ambient temperature, when the two base-emitter voltages $U_{BE1}$, $U_{BE2}$ of the transistors T1, T2 are the same. Since, in practice, various influences cause these two voltages to be unequal, to compensate for this, another transistor T3 or T4 is connected in the incoming circuit as a unity-gain amplifier to each transistor T1, T2. With the aid of two current power sources I3, I4 in each emitter circuit of the other transistors T3, T4, the base-emitter voltages of the transistors T1+T3 and T2+T4 are adjusted so as to render the emitter currents $I_{E1}$, $I_{E2}$ equal in magnitude. This adjustment procedure does not always provide an optimal solution for a desired temperature range.

Figure 2:
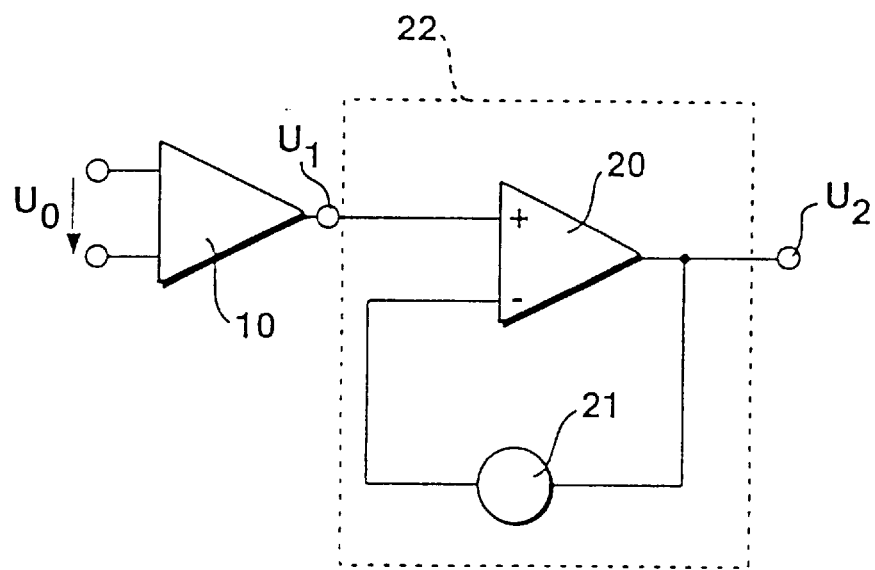
FIG. 2 shows an exemplary embodiment of an integrated circuit according to the present invention.

On the other hand, in the case of the exemplary embodiment according to the present invention, as shown in FIG. 2, compensation for the offset voltage of the known amplifier 10 is provided by a subsequently added voltage subtractor 22. The voltage subtractor 22 has an operational amplifier 20, whose output is fed back by means of a voltage sensor 21 to the inverting input. The voltage sensor 21 compensates for the component of the voltage $U_1$ of the amplifier 10 caused by offset voltages of the amplifier 10. Thus, the voltage $U_1$ amplified by the amplifier 10 less the subtracted voltage is able to be tapped off at the output $U_2$. This schematized block diagram is elucidated on the basis of FIG. 3.

This description assumes that the amplifier 10 is any amplifier whose offset response to temperature changes has not been adjusted. For the sake of clarity, the zero potential reference point and the current supply for the amplifier are left out. In the case of the voltage subtractor according to FIG. 3, a feedback resistor R is connected between the output $U_2$ and the inverting input (−) of the operational amplifier 20. Furthermore, at a node 31, two series-connected power current sources $I_1$, $I_2$, whose center tap (junction) is connected to the node 31, are connected between the inverting input (−) of the operation amplifier 20 and the resistor R.

The present invention provides for at least one of the two power current sources $I_1$, $I_2$ and/or the feedback resistor R to be adjustable so as to enable adjustment of the voltage at the resistor R. Thus, the output voltage $U_1$ is minus the voltage at the resistor R. The voltage at R is compensated by the adjustment so that it corresponds to the component of the output voltage $U_1$ of the amplifier 10 caused by offset voltages of the amplifier 10. The output voltage $U_2$ of the amplifier 20 is then equal to the offset-free amplified input voltage $U_0$ of the amplifier 10. The voltage subtractor 22 is then integrated, together with the amplifier 10, on the same semiconductor chip on the basis of defined rules.

Figure 4:
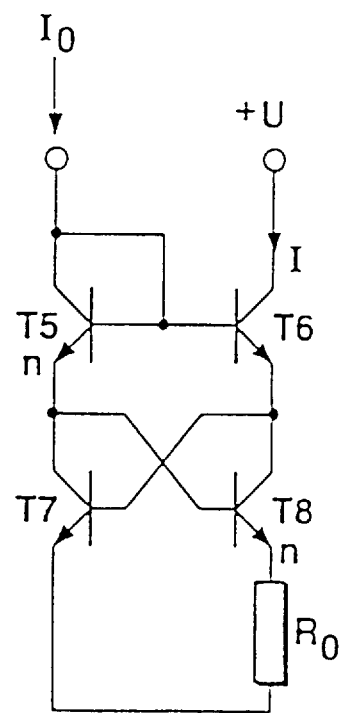
FIG. 4 depicts a ring-type current source according to the present invention.

To avoid tolerances of the individual power current sources $I_1$, $I_2$, a ring-type current source in accordance with FIG. 4 is proposed as a power current source. This current-source type is preferably used for all amplifiers or amplifier stages and amplifiers or amplifier stages of the subtraction circuit. The ring-type current source is only shown schematically, since it is known in the art.

The transistors T5, T6 connected as a current mirror (current-balancing circuit) are interconnected to their base. The transistor T5 includes in this case a predetermined number of transistors, which are connected in parallel. In integration technology, these transistors are realized, for example, by parallel-connected emitters. Two transistors T7 or T8 are connected in the outgoing circuit to the two transistors T5, T6, the transistor T8 having the same number n of emitters as the transistor T5. The base of the two transistors T7, T8 is connected crosswise with the corresponding emitters of the transistors T5, T6. A resistor $R_0$ is connected in the emitter path of the transistor T8. On the collector side, the transistor T6 is connected to a voltage source U.

An input current $I_0$ is provided via the left current path of the arrangement as shown in FIG. 4, so that a current I flows via the right current path through the transistor T6. This current I adjusts itself on the basis of the mirror (current-balancing) conditions and the symmetrical arrangement in the right branch as expressed by the following equation:

$$I = \frac{U_T}{R_0} * \ln(n^2)$$

$U_T$ being the voltage equivalent of thermal energy (thermal stress)

$$\frac{k*T}{e}$$

and n being the number of parallel-connected emitters.

Figure 3:
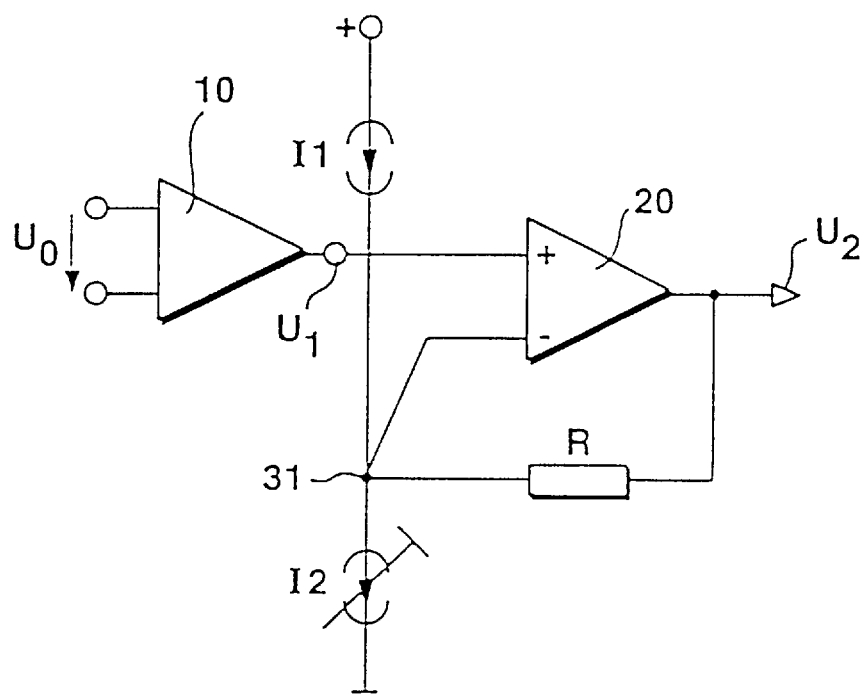
FIG. 3 shows a circuit diagram of a voltage subtractor according to the present invention.

The currents $I_1$ and $I_2$ shown in FIG. 3 are formed by similarly composed ring-type current sources as illustrated in FIG. 4, with the currents $I_1$ and $I_2$ being provided through the right current path of the respective ring-type current source. The adjustment provided for the power current source $I_2$ is provided by the resistor $R_0$ in FIG. 4.

The feedback resistor R of the subtractor circuit 22 according to the present invention is developed according to the same design rules as the resistor $R_0$ in the current source. The ratio $R/R_0$ is constant over the entire temperature range.

What is claimed is:

1. An integrated circuit, comprising:

an amplifier circuit; and a voltage subtractor circuit coupled to a predetermined current path of the amplifier circuit, the voltage subtractor circuit compensating for a temperature dependent voltage offset of the amplifier circuit, wherein the voltage subtractor circuit includes an operational amplifier having a feedback path, the feedback path including a voltage sensor and being connected to an inverting input of the operational amplifier, and wherein the voltage sensor includes a first power current source connected in series at a junction to a second power current source and to a resistor, the resistor being connected to the junction between the first and second power current sources and in the feedback path.

2. The integrated circuit according to claim 1, wherein the voltage subtractor is coupled to an output of the amplifier circuit.

3. The integrated circuit according to claim 1, wherein the voltage subtractor is coupled to an input of the amplifier circuit.

4. The integrated circuit according to claim 1, wherein at least one of the resistor, the first power current source and the second power current source has an adjustable value.

5. The integrated circuit according to claim 1, wherein the voltage subtractor circuit has a temperature coefficient substantially equal to a temperature coefficient of the amplifier circuit.

6. The integrated circuit according to claim 1, wherein each of the first and second power current sources is a ring-type current source including a second resistor.

7. The integrated circuit according to claim 6, wherein a ratio of the first resistor to the second resistor is constant over a predetermined temperature range.

* * * * *